US006236270B1

(12) United States Patent
Takeuchi

(10) Patent No.: US 6,236,270 B1
(45) Date of Patent: May 22, 2001

(54) OPERATIONAL AMPLIFIER CIRCUIT INCLUDING FOLDED CASCODE CIRCUIT

(75) Inventor: Junichi Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,980

(22) Filed: Dec. 15, 1999

(30) Foreign Application Priority Data

Dec. 16, 1998 (JP) ................................. 10-358229

(51) Int. Cl.[7] ...................................... H03F 3/45

(52) U.S. Cl. ........................ 330/253; 330/255; 330/257

(58) Field of Search .................... 330/252, 253, 330/255, 257

(56) References Cited

U.S. PATENT DOCUMENTS 4,963,834 * 10/1990 Yukawa ................................ 330/253

OTHER PUBLICATIONS

Ribner, et al., "Design Techniques for Cascoded CMOS Op Amps with Improved PSRR and Common–Mode Input Range", IEEE Journal of Solid–State Circuits, vol. SC–19, No. 6, Dec. 1984, pp. 919–920.

* cited by examiner

Primary Examiner—Steven J. Mottola
(74) Attorney, Agent, or Firm—McGinn & Gibb, PLLC

(57) ABSTRACT

The operational amplifier circuit of the present invention includes a first pair of NMOS which receives a first and a second input voltages to respective gate electrodes and has the source electrodes connected in common, a first pair of PMOS whose gate electrodes are connected in common and whose respective source electrodes are connected to respective drain electrodes of the first pair of NMOSs, a second pair of NMOSs whose gate electrodes are connected in common, whose respective source electrodes are connected to respective drain electrodes of the first PMOS, and whose drain electrodes are connected to a current mirror composed of a second pair of PMOS which is based on the first power supply voltage, and another PMOS whose gate electrode is connected to the drain electrode of one of the second pair of NMOS transistor, whose source electrode receives the first power supply voltage, and whose drain electrode is connected to a constant current source composed of another NMOS transistor whose one end is connected to the second power supply voltage.

20 Claims, 2 Drawing Sheets

OPERATIONAL AMPLIFIER CIRCUIT INCLUDING FOLDED CASCODE CIRCUIT

BACKGROUND OF THE INVENTION

1. Field of the Invention

The present invention relates to an operational amplifier circuit, and more particularly to an operational amplifier circuit including a folded cascode circuit, suitable for application to semiconductor integrated circuits.

2. Description of the Related Art

FIG. 2 is a circuit diagram showing an example of the electrical configuration of a conventional operational amplifier circuit.

This example of the operational amplifier circuit represents the one disclosed in IEEE Journal of Solid-State Circuits, Vol. SC-19, p. 920, 1984. The circuit is mainly composed of P-channel MOS transistors (referred to as PMOSs hereinafter) 1 to 8, N-channel MOS transistors (referred to as NMOSs hereinafter) 9 to 14, and a capacitor 15.

The PMOSs 1 and 2 constitute a differential transistor pair in which input voltages $V_{IN1}$, and $V_{IN2}$ are applied to their respective gates, and their respective source electrodes are connected in common to the drain electrode of the PMOS 3. The drain electrode of the PMOS 1 is connected to the source electrode of the NMOS 10, and the drain electrode of the PMOS 2 is connected to the source electrode of the NMOS 11. The PMOS 3 receives a first power supply voltage $V_1$ to its source electrode and receives a reference bias voltage $V_{B11}$ to its gate electrode, and constitutes a constant current source.

The PMOS 4 receives the first power supply voltage $V_1$ to its source electrode and receives the reference bias voltage $V_{B11}$ to its gate electrode to form a constant current source, and has its drain electrode connected to the source electrode of the PMOS 5. The PMOS 5 receives an input voltage $V_{IN2}$ to its gate electrode, and constitutes an input transistor pair together with the PMOS 2. The drain electrode of the PMOS 5 is connected to the drain electrode and the gate electrode of the NMOS 9. The NMOS 9 receives a second power supply voltage $V_2$ to its source electrode, and its gate electrode and drain electrode are connected to the gates of NMOSs 12 and 13 to constitute a constant current source. The PMOSs 6 and 7 constitute a current mirror in which an equal amount of current is made to flow in each transistor, receive the first power supply voltage $V_1$ to respective source electrodes, have respective gate electrodes connected to the drain electrode of the PMOS 6, and receive a reference voltage $V_{REF}$ to the connection point. Moreover, the gate electrode and the drain electrode of the PMOS 6 are connected to the drain electrode of the NMOS 10, and the drain electrode of the PMOS 7 is connected to the drain electrode of the NMOS 11. The gate electrodes of the NMOSs 10 and 11 are interconnected, and receive a reference bias voltage V12. The NMOSs 12 and 13 constitute a constant current source, where respective source electrodes receive the second power supply voltage $V_2$, the drain electrode of the NMOS 12 is connected to the source electrode of the NMOS 10, and the drain electrode of the NMOS 13 is connected to the source electrode of the NMOS 11. The PMOSs 1 and 2, and the NMOSs 10 and 11 constitute a folded cascode stage, and an output voltage $V_{FCOUT}$ of the folded cascode stage is taken out from the drain electrode of the NMOS 11.

The PMOS 8 is an output transistor, where its source electrode receives the first power supply voltage $V_1$, its gate electrode is connected to the drain electrode of the NMOS 11, and its drain electrode is connected to the drain electrode of the NMOS 14. The NMOS 14 is a constant current load, its gate electrode receives a reference bias voltage $V_{B13}$, and its source electrode receives the second power supply voltage $V_2$. The PMOS 8 and the NMOS 14 constitute an inverting amplifier which amplifies the output voltage $V_{FCOUT}$ of the folded cascode stage by inverting it, and outputs the result from the drain electrode of the PMOS 8 as an output voltage $V_{OUT}$. The capacitor 15 is for phase compensation, and has its one end connected to the source electrode of the NMOS 11, and the other end connected to the drain electrode of the PMOS 8.

With such a configuration, it is possible to realize a current supply type operational amplifier which has a high gain and a wide bandwidth.

Now, the conventional operational amplifier circuit described above has an input stage that consists of the PMOSs 1, 2, and 5 so that it has a low input impedance and is of a low potential input type. Accordingly, the circuit is not applicable to a circuit, such as an interface part of a data transmission/reception circuit, which requires a high potential input because of the normally high potential output of a circuit connected in the preceding stage.

For this reason, it is necessary to constitute the input stage using NMOSs which have high input impedances. In that case, if a PMOS (PMOS 8 in FIG. 2) with a large gate electrode width continues to be employed for the output stage in order to enhance the current supply capability to meet the requirement that the operational amplifier circuit be of a current supply type, then the output voltage $V_{OUT}$ is affected by the variations in the power supply and the dispersion in the threshold voltage $V_t$ of the output stage PMOS, which gives rise to a problem that the offset between the input voltages $V_{IN1}$, $V_{IN2}$ and the output voltage $V_{OUT}$ is large. Namely, if the threshold voltage $V_t$ of the output stage PMOS is low, the output current of the output stage PMOS becomes large, and if the threshold voltage $V_t$ of the output stage PMOS is high, the output current of the output stage PMOS becomes small, and these variations show themselves up as the variations in the output voltage $V_{OUT}$, which makes the offset large.

In this connection, if the input stage is constituted of PMOSs, the dispersion of the threshold voltage $V_t$ of one (PMOS 7 in FIG. 2) of the PMOSs constituting the current mirror connected to the folded cascode stage and the dispersion of the threshold voltage $V_t$ of the PMOS (PMOS 8 in FIG. 2) have the same direction, so that they cancel each other, and the offset can be suppressed.

With this constitution, however, it is impossible to realize a high potential input because the input stage is formed of PMOSs.

SUMMARY OF THE INVENTION

It is therefore the object of the present invention to provide a current supply type operational amplifier circuit which has a high gain and a wide bandwidth, is of a high potential input type and is capable of suppressing the input/output offset.

An operational amplifier circuit of the present invention comprises a first transistor of a first conductivity type having a first control gate supplied with a first input voltage and a first current path coupled between a first node and a second node; a second transistor of the first conductivity type having a second control gate supplied with a second input voltage and a second current path coupled between the first node and a third node; a third transistor of a second conductivity type having a third control gate and a third current path coupled between the third node and a fourth node; a fourth transistor of the second conductivity type having a fourth control gate coupled to the third control gate and a fourth current path coupled between the second node and a fifth node; a fifth transistor of the first conductivity type having a fifth control gate and a fifth current path coupled between the fourth node and a sixth node; a sixth transistor of the first conductive type having a sixth control gate coupled to the fifth control gate and having a sixth current path coupled between the fifth node and seventh node; a current mirror circuit having an input node coupled to the sixth node and an output node coupled to the seventh node; and a seventh transistor of the second conductive type having a seventh control gate coupled to the seventh node.

BRIEF DESCRIPTION OF THE DRAWINGS

The above and other objects, features and advantages of the present invention will be more apparent from the following description taken in conjunction with the accompanying drawings, in which.

DESCRIPTION OF A PREFERRED EMBODIMENT

Figure 1:
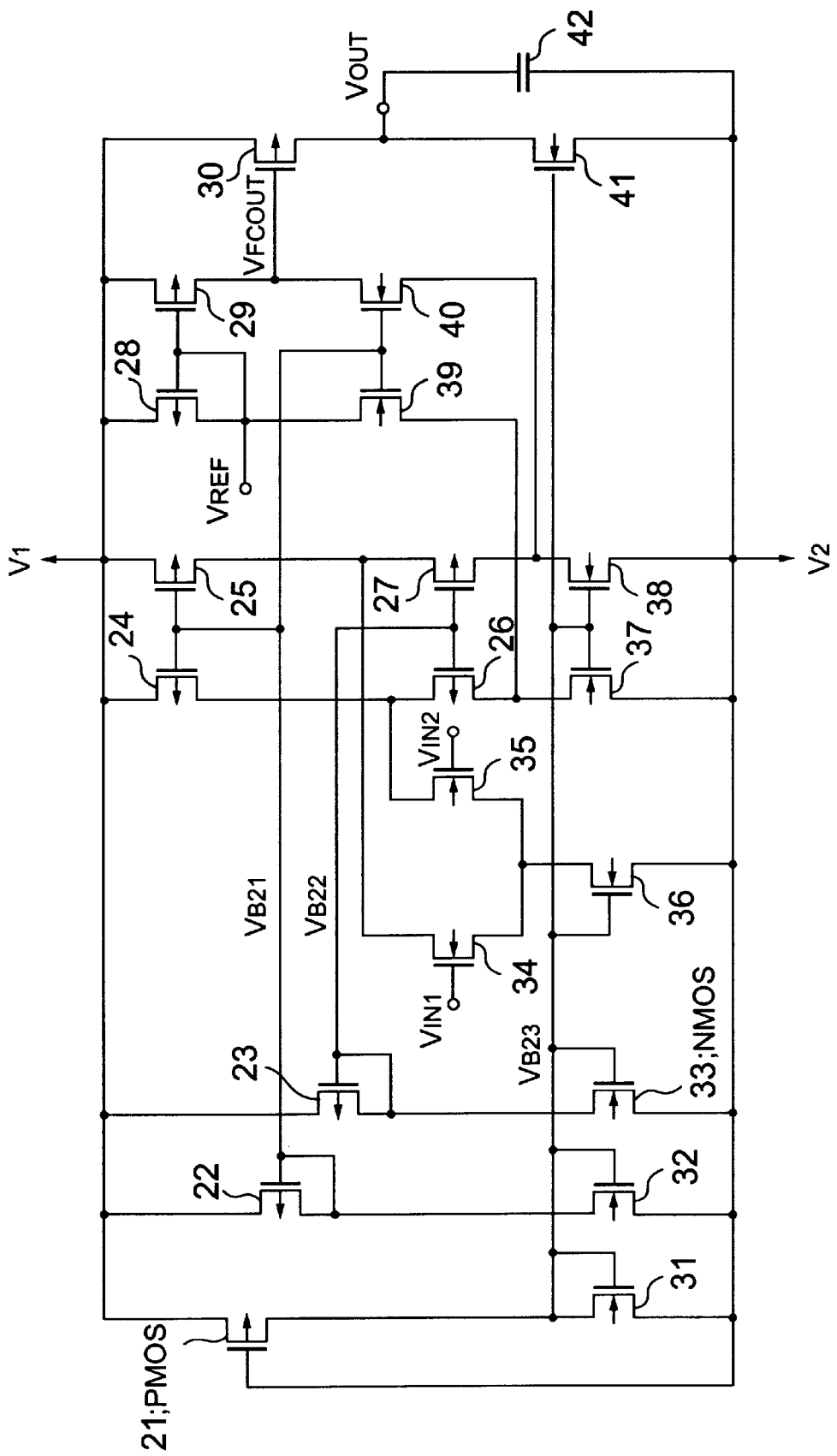
FIG. 1 is a circuit diagram showing the electrical configuration of an embodiment of the operational amplifier circuit according to this present invention.
Figure 2:
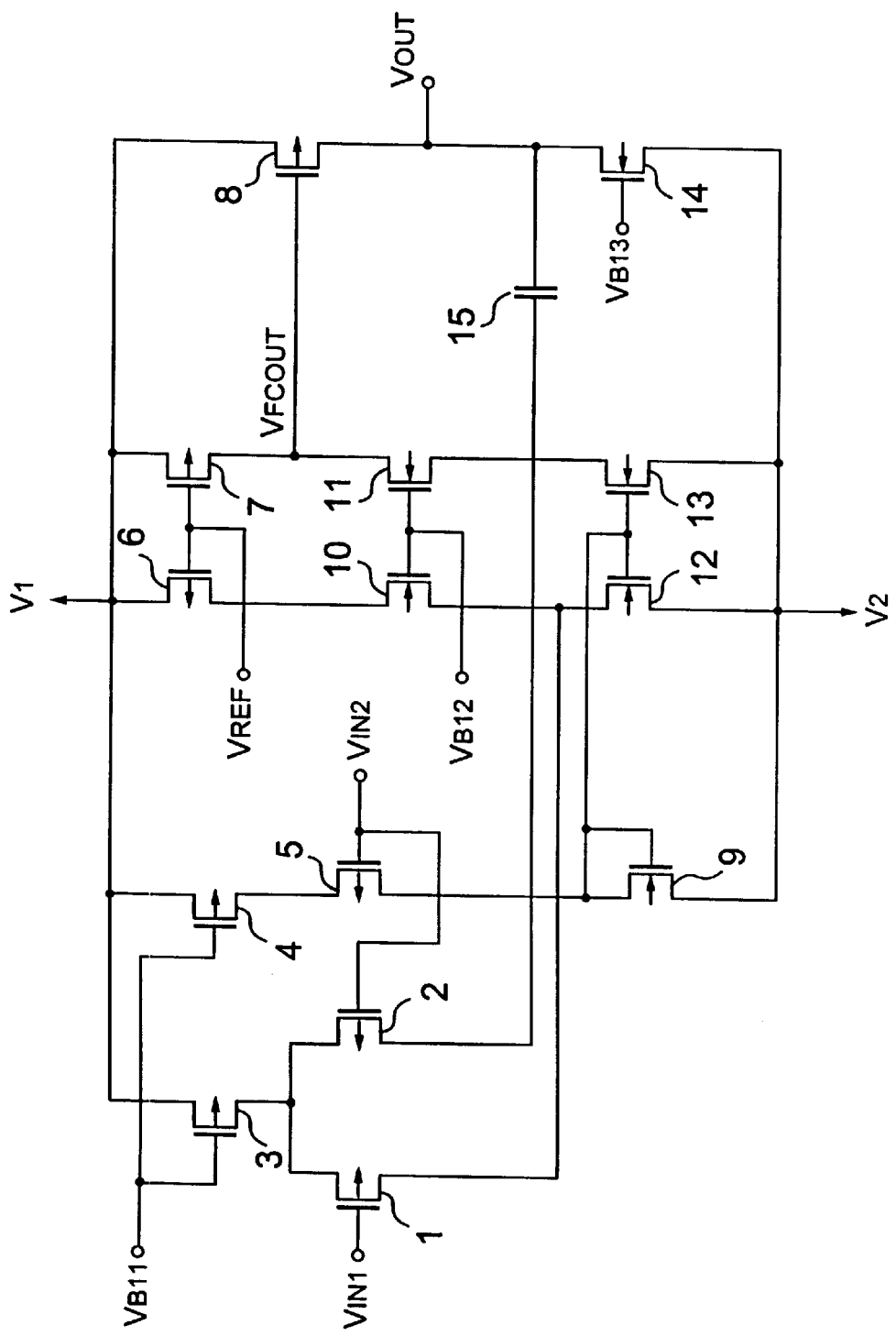
FIG. 2 is a circuit diagram showing the electrical configuration of a conventional operational amplifier circuit.

FIG. 1 is a circuit diagram showing the electrical configuration of an embodiment of the operational amplifier circuit according to the present invention.

The operational amplifier circuit includes a reference bias voltage generator circuit, and is mainly composed of PMOSs 21 to 30, NMOSs 31 to 41, and a capacitor 42.

The PMOSs 21 to 23 and the NMOSs 31 to 33 constitute a reference bias voltage generator circuit, and supply reference bias voltages $V_{B21}$ to $V_{B23}$.

The NMOSs 34 and 35 constitute a differential transistor pair, where the respective gate electrodes receive the input voltages $V_{IN1}$, and $V_{IN2}$, and the respective source electrodes are connected in common to the drain electrode of the NMOS 36. Further, the drain electrode of the NMOS 34 is connected to the source electrode of the PMOS 27, and the drain electrode of the NMOS 35 is connected to the source electrode of the PMOS 26. The NMOS 36 receives a second power supply voltage $V_2$ to its source electrode and receives a reference bias voltage $V_{B23}$ to its gate electrode to constitute a constant current source.

The PMOSs 24 and 25 receive a first power supply voltage $V_1$ to respective source electrodes, and their gate electrodes are interconnected and receive a reference bias voltage $V_{B21}$ to constitute a constant current source. Further, the drain electrode of the PMOS 24 is connected to the drain electrode of the NMOS 26, and the drain electrode of the PMOS 25 is connected to the drain electrode of the NMOS 27.

Respective gate electrodes of the PMOSs 26 and 27 are interconnected and receive a reference bias voltage $V_{B22}$. The NMOSs 37 and 38 constitute a current mirror, where their respective source electrodes receive the second power supply voltage $V_2$, and their respective gate electrodes are interconnected and receives the reference bias voltage $V_{B23}$. Further, the drain electrode of the NMOS 37 is connected to the drain electrode of the PMOS 26, and the drain electrode of the NMOS 38 is connected to the drain electrode of the PMOS 27. The NMOSs 34, 35 and the PMOSs 26, 27 constitute a first folded cascode stage. That is, each of the PMOSs 26, 27 is a first folded cascode transistor.

The PMOSs 28 and 29 constitute a current mirror in which respective source electrodes receive the first power supply voltage $V_1$, respective gate electrodes are connected to the drain electrode of the PMOS 28 to receive a reference voltage $V_{REF}$. In addition, the gate electrode and the drain electrode of the PMOS 28 are connected to the drain electrode of the NMOS 39, and the drain electrode of the PMOS 29 is connected to the drain electrode of the NMOS 40. The gate electrodes of the NMOSs 39 and 40 are interconnected to receive a reference bias voltage $V_{B21}$. The source electrode of the NMOS 39 is connected to the drain electrode of the PMOS 26, and the source electrode of the NMOS 40 is connected to the drain electrode of the PMOS 27. The PMOSs 26, 27 and the NMOSs 39, 40 constitute a second folded cascode stage. That is, each of PMOSs 26, 27 is a second folded cascode transistor. The output voltage $V_{FCOUT}$ of the second folded cascode stage can be taken out from the drain electrode of the NMOS 40.

The PMOS 30 is an output transistor in which its source electrode receives the first power supply voltage $V_1$, its gate electrode is connected to the drain electrode of the NMOS 40, and its drain electrode is connected to the drain electrode of the NMOS 41. The NMOS 41 is a constant current load in which its gate electrode receives the reference bias voltage $V_{B23}$, and its source electrode receives the second power supply voltage $V_2$. The PMOS 30 and the NMOS 41 constitute an inverting amplifier which inverts and amplifies the output voltage $V_{OUT}$ of the second folded cascode stage, and outputs the result from the drain electrode of the PMOS 30 as an output voltage $V_{OUT}$. The capacitor 42 is for phase compensation, and its one end is connected to the drain electrode of the PMOS 30 and its the other end receives the second power supply voltage $V_2$.

According to this configuration, since the input stage is constituted of the NMOSs 34 and 35 which have high input impedance, it is adapted to high potential input. Moreover, since the first folded cascode stage constituted of the NMOSs 34, 35, and the PMOSs 26, 27, and the second folded cascode stage constituted of the PMOSs 26, 27 and the NMOSs 39, 40 are connected in series, this operational amplifier has a high gain and a wide bandwidth.

Furthermore, since the output stage of this operational amplifier is constituted of the inverting amplifier consisting of the PMOS 30 and the NMOS 41, it is of current supply type. In this case, the variations of the power supply and the dispersion of the threshold voltage $V_t$ of the PMOS 30 of the output stage are in the same direction as the dispersion of the threshold voltage $V_t$ of the PMOS 29 constituting the current mirror connected to the second folded cascode stage, so that these dispersions cancel each other.

Next, an operation of the circuit shown in FIG. 1 is explained as follows.

For example, this circuit is used as a negative feed-back amplifier by connecting the output terminal which outputs the output voltage $V_{out}$ with an input terminal of the transistor 35 which outputs the input voltage $V_{IN2}$.

When an input terminal of the transistor 34 is supplied to a constant voltage $V_i$ as input voltage $V_{IN1}$, the output terminal outputs the same voltage $V_i$ as the output voltage $V_{out}$ in a stationary state.

When the input voltage $V_{IN2}$ is lower than the voltage $V_i$, the voltage between the source and gate of the transistor 34 is larger than the voltage between the source and gate of the transistor 35 so that a current flowing in the source-drain current path of the transistor 34 is larger than that of the source-drain current path of the transistor 35. Since each of transistors 37 and 38 flows the same constant current and each of transistors 24 and 25 flows the same constant current, a current flowing in the transistor 26 is larger than a current flowing in the transistor 27. Therefore, a current flowing in the transistor 40 is larger than a current flowing in the transistor 39. Since the voltage $V_{FCOUT}$ becomes lower by the current mirror of the transistors 28 and 29, the output voltage $V_{out}$, that is, the input voltage $V_{IN2}$ becomes higher until each of the input voltages $V_{IN1}$, $V_{IN2}$, and the output voltage $V_{out}$ becomes equal.

When the input voltage $V_{IN2}$ is higher than the voltage potential $V_i$, the explanation is omitted because the operation is the opposite to the operation in the input voltage $V_{IN2}$ being higher than the voltage potential $V_i$.

Accordingly, the offset between the input voltages $V_{IN1}$, $V_{IN2}$ and the output voltage $V_{OUT}$ can be suppressed.

In this way, according to the constitution of this example, it is possible to provide an operational amplifier circuit which has a high gain and a wide bandwidth, is adapted to high potential input and is of current supply type, and yet is capable of suppressing the input/output offset.

Accordingly, it is possible to apply the operational amplifier circuit of this example to a circuit which is required to input signals of high potential, such as the interface of data transmission and reception circuit, because of the normally high potential output of the circuit connected in the preceding stage.

In the above, referring to the drawings, an embodiment of this invention has been described in detail.

However, the specific constitution is not limited to this embodiment, and the modifications of design or the like of the embodiment within the scope and spirit of the invention will naturally be considered to be included in this invention.

For example, although an example is shown in the above where the same reference bias voltage $V_{B21}$ is applied to the connection point of the gate electrodes of the PMOSs 24 and 25 that constitute the constant current source, and to the connection point of the gate electrodes of the PMOSs 39 and 40 that constitute the second folded cascode stage, it is not limited to this case, and some other reference bias voltage may be applied.

Moreover, although an example is shown in the above embodiment where the same reference bias voltage $V_{B23}$ is applied to the gate electrode of the NMOS 36 that constitutes the constant current source, to the connection point of the gate electrodes of the NMOSs 37 and 38 that constitute the current mirror, and to the gate electrode of the NMOS 41 that is the constant current load, it is not limited to this case, and some other reference bias voltage may be applied.

Moreover, although an example is shown in the above embodiment where the phase compensating capacitor 42 is inserted between the drain electrode of the PMOS 30 and the terminal of the second power supply voltage $V_2$, it is not limited to this case, and the capacitor 42 may be inserted between, for example, the drain electrode and the gate electrode of the NMOS 41.

Moreover, although an example is shown in the above embodiment in which two folded cascode stages are connected in series, it is not limited to this case, and three or more stages may be connected in series. With such a constitution more satisfactory properties can be obtained.

Note, however, then that it becomes necessary to control the dispersion generated in the manufacturing process such as the diffusion process.

Furthermore, although an example is shown in the above embodiment in which the operational amplifier circuit is constructed using the PMOSs and the NMOSs, it is not limited to this case, and the operational amplifier circuit of this example may be constructed by using bipolar transistor consisting of the PNP transistor and the NPN transistor.

As described in the above, according to the constitution of this invention, an operational amplifier circuit is obtained in which the input stage is formed using a first and a second transistors having high input impedance, two stages of the folded cascode stages are connected in series, and a seventh transistor whose third electrode is connected to a constant current source is provided as the output stage. Accordingly, it is possible to obtain an operational amplifier circuit which has a high gain and a wide bandwidth, is of current supply type and is adapted to high potential input, and is also capable of suppressing the input/output offset.

What is claimed is:

1. An operational amplifier circuit comprising:
   a first transistor of a first conductivity type having a first control gate supplied with a first input voltage and a first current path coupled between a first node and a second node;
   a second transistor of said first conductivity type having a second control gate supplied with a second input voltage and a second current path coupled between said first node and a third node;
   a third transistor of a second conductivity type having a third control gate and a third current path coupled between said third node and a fourth node;
   a fourth transistor of said second conductivity type having a fourth control gate coupled to said third control gate and a fourth current path coupled between said second node and a fifth node;
   a fifth transistor of said first conductivity type having a fifth control gate and a fifth current path coupled between said fourth node and a sixth node;
   a sixth transistor of said first conductive type having a sixth control gate coupled to said fifth control gate and having a sixth current path coupled between said fifth node and seventh node;
   a current mirror circuit having an input node coupled to said sixth node and an output node coupled to said seventh node; and
   a seventh transistor of said second conductive type having a seventh control gate coupled to said seventh node.

2. The amplifier circuit as claimed in claim 1, said amplifier circuit further comprising:
   a first constant current source coupled between said first node and a first power source line.

3. The amplifier circuit as claimed in claim 1, said amplifier circuit further comprising:
   a second constant current source coupled between said third node and a second power source line; and
   a third constant current source coupled between said second node and said second power source line.

4. The amplifier circuit as claimed in claim 3, wherein a current flowing in said second constant current source is substantially equal to a current flowing in said third constant current source.

5. The amplifier circuit as claimed in claim 1, said amplifier circuit further comprising:

a fourth constant current source coupled between said fourth node and a first power source line; and a fifth constant current source coupled between said fifth node and said first power source line.

6. The amplifier circuit as claimed in claim 5, wherein a current flowing in said fourth constant current source is substantially equal to a current flowing in said fifth constant current source.

7. The amplifier circuit as claimed in claim 1, wherein said third and fourth control gates are supplied with a first constant voltage and said fifth and sixth control gates are supplied with a second constant voltage.

8. The amplifier circuit as claimed in claim 1, said amplifier circuit further comprising a sixth constant current source coupled between a first power source line and an output node, wherein said seventh transistor has a seventh current path coupled between said output node and a second power source line.

9. The amplifier circuit as claimed in claim 1, wherein said first, second, fifth, and sixth transistors are N-channel MOS transistors, and said third, fourth, and seventh transistors are P-channel MOS transistors.

10. The amplifier circuit as claimed in claim 1, wherein said first, second, fifth, and sixth transistors are NPN transistors, and said third, fourth, and seventh transistors are PNP transistors.

11. An operational amplifier circuit comprising:

a first transistor of a first conductivity type having a first control gate supplied with a first input voltage and a first current path coupled between a first node and a second node;

a second transistor of said first conductivity type having a second control gate supplied with a second input voltage and a second current path coupled between said first node and a third node;

a third transistor of a second conductivity type having a third control gate supplied with a first constant voltage and a third current path coupled between said third node and a fourth node;

a fourth transistor of said second conductivity type having a fourth control gate supplied with said first constant voltage coupled to said third control gate and a fourth current path coupled between said second node and a fifth node;

a fifth transistor of said first conductivity type having a fifth control gate supplied with a second constant voltage and a fifth current path coupled between said fourth node and a sixth node;

a sixth transistor of said first conductivity type having a sixth control gate supplied with a second constant voltage coupled to said fifth control gate and having a sixth current path coupled between said fifth node and seventh node;

a current mirror circuit having an input node coupled to said sixth node and an output node coupled to said seventh node;

a seventh transistor of said second conductive type having a seventh control gate coupled to said seventh node;

a first constant current source coupled between said first node and a first power source line;

a second constant current source coupled between said third node and a second power source line;

a third constant current source coupled between said second node and said second power source line;

a fourth constant current source coupled between said fourth node and said first power source line;

a fifth constant current source coupled between said fifth node and said first power source line; and a sixth constant current source coupled between said first power source line and an output node;

wherein said seventh transistor has a seventh current path coupled between said output node and said second power source line.

12. The amplifier circuit as claimed in claim 11, wherein a current flowing in said second constant current source is substantially equal to a current flowing in said third constant current source.

13. The amplifier circuit as claimed in claim 12, wherein a current flowing in said fourth constant current source is substantially equal to a current flowing in said fifth constant current source.

14. An amplifier circuit comprising:

an input circuit receiving a first input signal and a second input signal;

a first folded cascode connected transistor pair coupled to said input circuit;

a second folded cascode connected transistor pair coupled to said first folded cascode connected transistor pair so that said input circuit, said first folded cascode connected transistor pair and said second folded cascode connected transistor pair are connected in series; and an output circuit coupled to said second folded cascode connected transistor pair to output an output signal.

15. The amplifier circuit as claimed in claim 14, wherein said input circuit includes a first transistor of a first conductive type receiving said first input signal and a second transistor of said first conductive type receiving said second input signal.

16. The amplifier circuit as claimed in claim 15, wherein said first folded cascode connected transistor pair includes a third transistor of a second conductive type coupled to said second transistor and a fourth transistor of said second conductive type coupled to said first transistor.

17. The amplifier circuit as claimed in claim 16, wherein said second folded cascode connected transistor pair includes a fifth transistor of said first conductive type coupled to said third transistor and a sixth transistor of said first conductive type coupled to said fourth transistor.

18. The amplifier circuit as claimed in claim 17, wherein said output circuit includes a seventh transistor of said second conductive type having a control gate coupled to said sixth transistor to output said output signal.

19. The amplifier circuit as claimed in claim 18, wherein said first, second, fifth, and sixth transistors are N-channel MOS transistors, and said third, fourth, and seventh transistors are P-channel MOS transistors.

20. The amplifier circuit as claimed in claim 18, wherein said first, second, fifth, and sixth transistors are NPN transistors, and said third, fourth, and seventh transistors are PNP transistors.

* * * * *